United States Patent [19]

Akiba et al.

[11] Patent Number: 4,648,096
[45] Date of Patent: Mar. 3, 1987

[54] DISTRIBUTED FEEDBACK SEMICONDUCTOR LASER

[75] Inventors: Shigeyuki Akiba, Tokyo; Katsuyuki Utaka, Musashino; Kazuo Sakai, Tokyo; Yuichi Matsushima, Tanashi, all of Japan

[73] Assignee: Kokusai Denshim Denwa Kabushiki Kaisha, Tokyo, Japan

[21] Appl. No.: 660,934

[22] Filed: Oct. 15, 1984

[30] Foreign Application Priority Data

Oct. 18, 1983 [JP] Japan ................ 58-193472

[51] Int. Cl.[4] .......................................... H01S 3/19
[52] U.S. Cl. .................................... 372/96; 357/17; 372/46; 372/50
[58] Field of Search ................ 372/96, 50, 46; 357/17

[56] References Cited

U.S. PATENT DOCUMENTS 4,096,446  6/1978  Haus et al. ........................ 372/96

FOREIGN PATENT DOCUMENTS 0140177  8/1983  Japan ............................ 372/96

Primary Examiner—James W. Davie
Attorney, Agent, or Firm—Robert E. Burns; Emmanuel J. Lobato; Bruce L. Adams

[57] ABSTRACT

A distributed feedback semiconductor laser which has periodic corrugations in a light emitting layer or an adjoining layer in the direction of travel of light and performs laser oscillation by the injection of carriers into said light emitting layer. In accordance with the present invention, there are provided, in the neighborhood of the center of a laser region, a region for changing the phase of the periodic corrugations by about 180 degrees, and, on the extension of the laser oscillation region at both sides thereof, a window region formed of a semiconductor larger in energy gap but smaller in refractive index than the light emitting layer, the length of the window region being so limited as to prevent substantial reflection of laser output light in the window region.

2 Claims, 8 Drawing Figures

DISTRIBUTED FEEDBACK SEMICONDUCTOR LASER

BACKGROUND OF THE INVENTION

The present invention relates to improvement in or relating to a distributed feedback semiconductor laser.

A semiconductor laser, developed as a light source for optical fiber communications, which forms the basis of optical communication systems, has hitherto undergone various improvements for use as a light source of longterm stability and high performance, and in paticular, a distributed feedback semiconductor laser (hereinafter referred to simply as a DFB laser), which is capable of operating at a single wavelength, has been highlighted in recent years.

The DFB laser has an excellent effect in its wide application used as a light source for optical communications; at present, however, there has not been developed a DFB laser which is stable enough to be employed as a light source for high reliability optical communications.

SUMMARY OF THE INVENTION

An object of the present invention is to provide a DFB laser of stable single-wavelength operation and easy to manufacture, by improvement, for obviating the abovesaid defects of the prior art, through a combination of the DFB laser having the phase inverting region in corrugations and the DFB laser having the window regions on both sides of the laser region.

In accordance with the present invention, there is proposed a distributed feedback semiconductor laser which has periodic corrugations in a light emitting layer or an adjoining layer in the direction of travel of light and performs laser oscillation by the injection of carriers into said light emitting layer, characterized in that there are provided, in the neighborhood of the center of a laser region, a region for changing the phase of the periodic corrugations by about 180 degrees, and, on the extension of the laser oscillation region at both sides thereof, a window region formed of a semiconductor larger in energy gap but smaller in refractive index than the light emitting layer, the length of the window region being so limited as to prevent substantial reflection of laser output light in the window region.

BRIEF DESCRIPTION OF THE DRAWINGS

The present invention will be described in detail below in comparison with prior art with reference to the accompanying drawings, in which.

DETAILED DESCRIPTION

To make differences between prior art and the present invention clear, conventional examples will first be described.

Figure 1A:
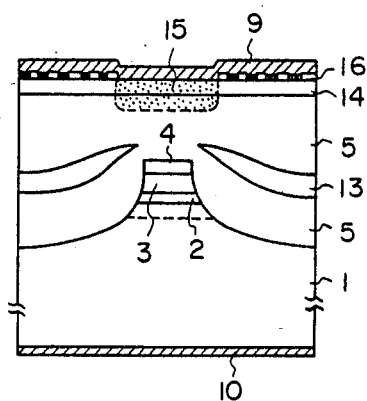
FIGS. 1A and 1B are a cross-sectional view and a longitudinal-sectional view of a conventional DFB laser having uniform periodic corrugations.
Figure 1B:
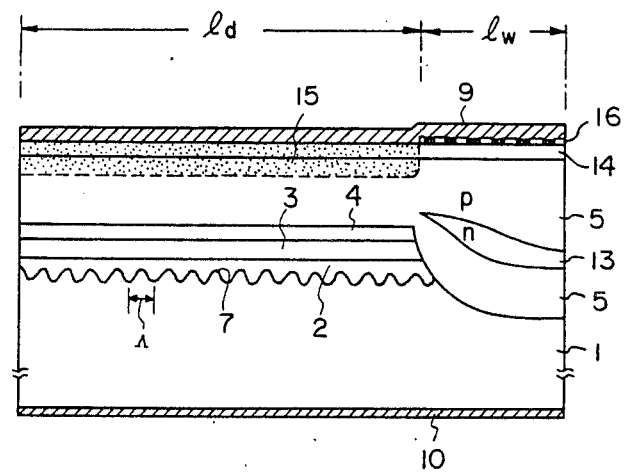

FIGS. 1A and 1B illustrate, in combination, a conventional DFB laser of a buried stripe structure as disclosed in laid-open Japanese patent application No. 58-140177, which is made of a compound semiconductor of the InGaAsP/InP system alloys, FIG. 1A being a cross-sectional view and FIG. 1B a longitudinal-sectional view. In FIGS. 1A and 1B, an n-type InGaAsP waveguide layer 2, an InGaAsP light emitting layer 3, a p-type InGaAsP buffer layer 5 and a p-type InP clad layer 5 are deposited first on an n-type InP substrate 1, and then a mesa-shaped stripe is formed, which is followed by the deposition of a p-type InP clad layer 5, an n-type InP layer 13, a p-type InP layer 5 and an n-type InGaAsP cap layer 14 through the use of a planar burying growth technique. After crystal growth, a zinc diffused region 15 is formed through an $SiO_2$ insulating film mask 16 and then electrodes 9 and 10 are formed. In this case, periodic corrugations 7 having a period $\Lambda$ are provided in the n-type InGaAsP waveguide layer 2 adjoining the light emitting layer.

A laser region, that is, a region in which the light emitting layer 3 is disposed, has a length $l_d$ in its lengthwise direction, and a window region of a length $l_w$ which is formed by an InP semiconductor layer larger in energy gap but smaller in refractive index than the light emitting layer is disposed at one end of the laser region lengthwise thereof. The other end of the laser region forms a cleavage plane. Such a DFB laser oscillates at the vicinity of the Bragg wave-length which is expressed by $\lambda_B = 2n_e\Lambda$, where $n_e$ is an equivalent refractive index of the laser region. Thus, in the DFB laser, since the window region has no waveguide structure, reflection is appreciably suppressed unlike in the Fabry-Perot mode oscillation by the reflection on both end faces of the laser, and oscillation develops only in a DFB mode based on the periodically corrugated structure.

Figure 2:
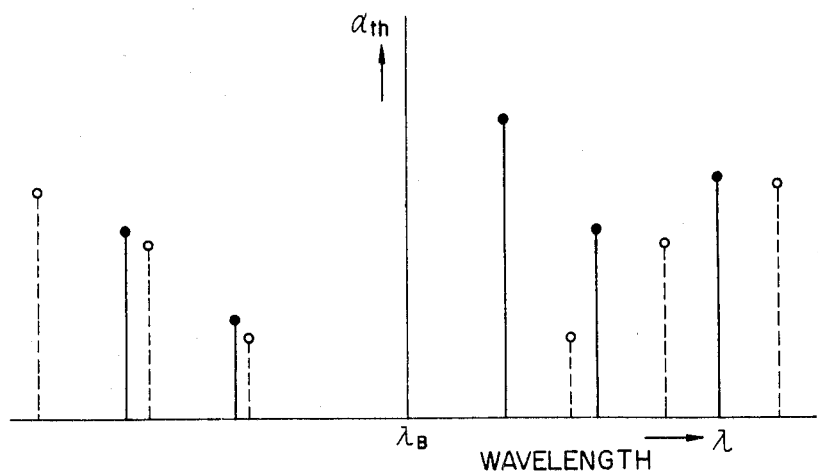
FIG. 2 is a graph showing the oscillation mode of the DFB laser depicted in FIG. 1.

FIG. 2 shows an example of the DFB mode, black and white circles indicate the DFB mode. The abscissa represents wavelength $\lambda$ and the ordinate an oscillation threshold gain $\alpha_{th}$. The white and black circles show two cases of different phases of the corrugations at the end face of the laser region which forms a cleavage plane. As is evident from FIG. 2, the DFB mode undergoes substantial changes according to the phase of the corrugations on the end face of the laser region.

For example, in the case of the black circles, since a certain difference in oscillation threshold gain between a mode of the smallest oscillation threshold gain $\alpha_{th}$ and the second lowest mode, a single-wavelength operation is performed at the wavelength of the smallest oscillation threshold gain $\alpha_{th}$.

On the other hand, in the case of the white circles, since there exist two modes which have the smallest oscillation threshold gain $\alpha_{th}$, a two-wavelength oscillation is caused. Accordingly, for performing the single-wavelength operation at all times, it is necessary to control the phase of the corrugations at the end face. Leaving considerations of forming aside the end face through utilization of cleavage, even if a chemical etching or some other precision etching method is employed, it is very difficult to make the corrugations in an appropriate phase position, since the period $\Lambda$ is less than one micron.

Accordingly, such a DFB laser as shown in FIG. 1 performs the single-wavelength operation in many cases but in some cases oscillates at two wavelengths at the same time. Further, since the single-wavelength operation is dependent upon the end face of the laser region exposed to the outside, the conventional laser is likely to present a problem in its stability when held in operation for a long time.

On the other hand, in a case where the window region is provided on both sides of the light emitting layer in the DFB laser of FIG. 1 in a manner to prevent the layer from exposure to the outside with a view to obviating the influence of the both end faces thereof, the laser always oscillates at two wavelengths theoretically.

Figure 3:
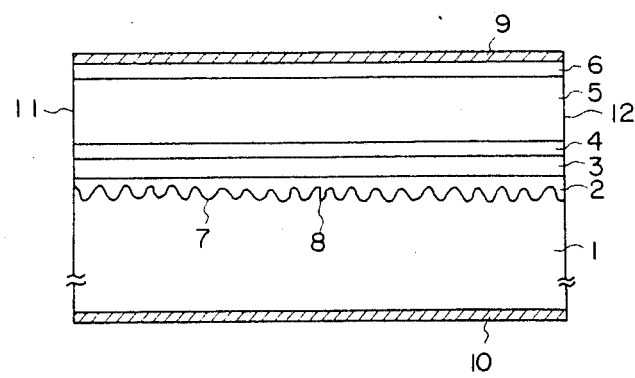
FIG. 3 is a longitudinal-sectional view illustrating an example of a DFB laser having a periodic corrugation-phase inverting region.

FIG. 3 illustrates a prior art example, as disclosed in U.S. Pat. No. 4,096,446, of an improvement of the DFB laser of FIG. 1 in which the phase of the periodic corrugations is inverted by 180° at the vicinity of the center of the laser region for performing a stable single-wavelength operation and which is identical in layer structure to the DFB laser of FIG. 1 except the p-type InGaAsP cap layer 6. With the DFB laser which has such a centrally disposed phase inverted region 8 in corrugations, assuming that the reflectivities of both end faces 11 and 12 are zero, the mode of the smallest threshold value exists at the Bragg wavelength $\lambda_B$ and a difference in the threshold gain between it and the second smallest threshold mode is large, as shown in FIG. 4, so that a very stable single-wavelength operation can be obtained.

Figure 4:
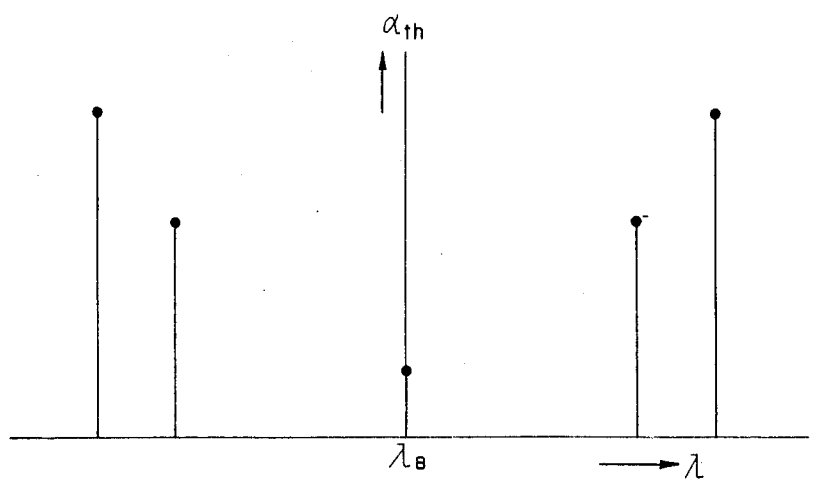
FIG. 4 is a graph showing the oscillation mode in the case of light being not reflected by both end faces.

If, however, the both end faces 11 and 12 have such a large reflectivity as does an ordinary cleavage plane, then such an ideal mode as shown in FIG. 4 is not obtained but the single- or two-wavelength operation is developed according to the phase of the corrugations in the end face, as in the case of FIG. 2. Therefore, it is extremely important, in such a DFB laser as shown in FIG. 3, to minimize the reflectivity of the both end faces 11 and 12. It can be readily considered that a simple solution to this problem is an antireflection coating, but it is very difficult to reduce reflectivity down to zero; usually, a reflectivity of several percent inevitably remains and such coating is not always highly reproducible. Especially in the DFB laser in which the phase of the corrugations at the end faces is important, the reflectivity of several percent greatly affects the DFB mode, and it is necessary to suppress the reflectivity at least 0.1% or less, but at present this requirement is not fulfilled. As described above, the conventional DFB laser has been difficult of performing stable single-wavelength operation at all times.

The present invention will hereinafter be described in detail.

Figure 5:
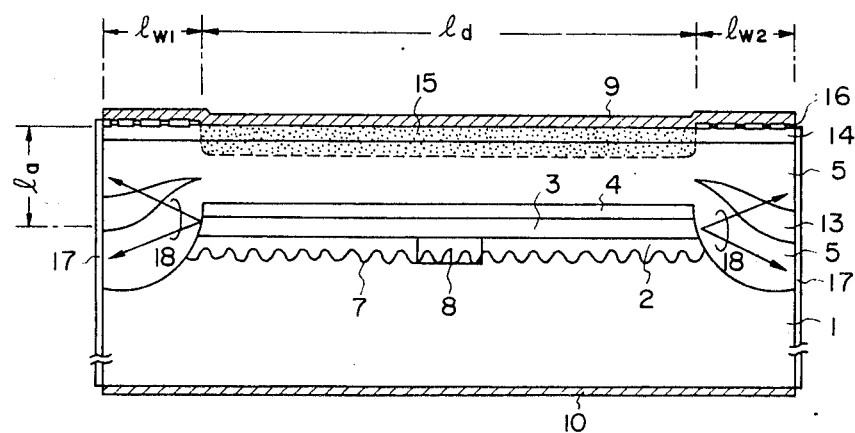
FIG. 5 is a longitudinal-sectional view illustrating an embodiment of the present invention.

FIG. 5 illustrates an embodiment of the present invention. On either side of the laser oscillation region of the length $l_d$, there is provided the window region which comprises p- and n-type InP layers 5 and 13 of a semiconductor which is larger in energy gap but smaller in refractive index than the InGaAsP light emitting layer 4. Further, a phase inverting region 8 is provided for inverting the phase of the periodic corrugations by 180°, and on each end face of the window region is given an antireflection coating 17.

Figure 7:
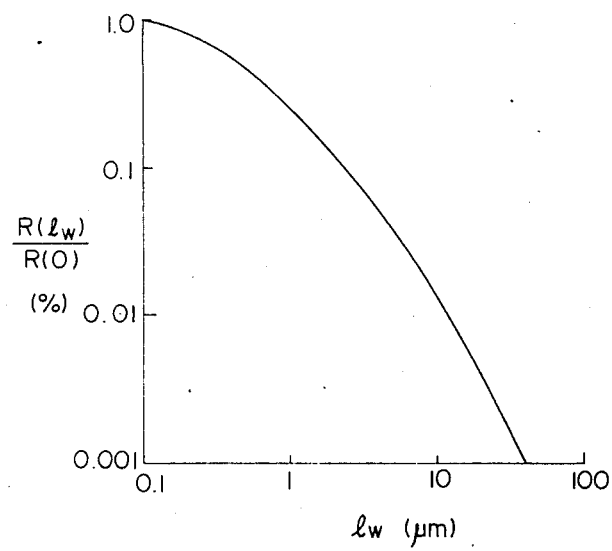
FIG. 7 is a graph showing the ratio of reflectivity to the length of the window region.

This embodiment has its feature in that since light 18 emitted from the laser oscillation region spreads in the window region, the ratio of light which is reflected by the end face back to the light emitting layer is markedly decreases. That is, this embodiment has such a structure that appreciably decreases the substantial reflectivity of each end face. In particular, taking into account the relationship between the reflectivity of the end face and the length $l_w$ of the window region, the latter is limited so that no substantial reflection of the laser output light occurs in the window region, thereby ensuring to take out the emitted light at a single wavelength and effectively. FIG. 7 is a graph showing the ratio of substantial reduction of reflectivity $R_r$ expressed as a function of the length $l_w$ of the window region, in a buried stripe structure. The reflectivity ratio shown in FIG. 7 is one that was obtained by dividing the effective reflectivity $R(l_w)$ in the presence of the window region by the reflectivity $R(o)$ in the absence of the window region.

As is evident from FIG. 7, the reflectivity was decreased by about two orders of magnitude by only providing a window region of approximately 10 $\mu$m length. Accordingly, even if the reflectivity of an ordinary cleavage plane is about 30%, it can be reduced down to 0.3% or so by the provision of a window region of 10 $\mu$m length. Moreover, the cleavage plane, when given an antireflection coating, diminishes its reflectivity in the range of between several percent to a few hundredths of percent; therefore, by providing a window region of several $\mu$m length given an antireflection coating, the reflectivity of the end face can be decreased to be negligibly small.

Figure 6:
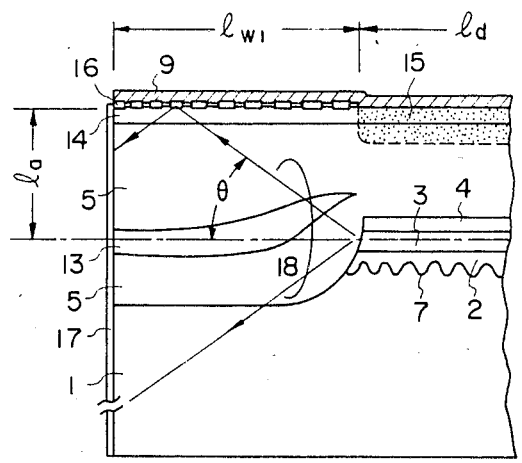
FIG. 6 is a longitudinal-sectional view illustrating an example of a structure in which the length of a window region is too large.

On the other hand, an increase in the length $l_w$ of the window region causes a decrease in the reflectivity, and when the length of the window region assumes a certain value, the reflectivity is almost zero, but in such a case, a portion of the emitted light 18 impinges against the upper electrode 9, as shown in FIG. 6, making it impossible to efficiently take out the laser output light. Accordingly, the length $l_w$ must be limited specifically to such a value that minimizes the reflectivity and permits efficient radiation of the output light. That is, in order to prevent substantial reflection of light in the window region, it is requisite that the lengths $l_{w1}$ and $l_{w2}$ of the both window regions be equal to or smaller than $l_a \tan(90-\theta)$, where $l_a$ is the thickness of the light emitting layer 3 from its center to the upper electrode 9. For example, the angle $\theta$ at which the laser output light 18 is emitted into the window region is usually 10 to 20 degrees, and $l_a$ is about 5 $\mu$m. Assuming that $\theta=10$ degrees and that $l_a=5$ $\mu$m, the lengths $l_{w1}$ and $l_{w2}$ are both less than about 28.4 $\mu$m, and in the case of $\theta=20$ degrees and $l_a=5$ $\mu$m, the above lengths are both less than approximately 13.7 $\mu$m. Accordingly, by setting the length $l_w$ of the window region to a value close to such upper limit values, the reflectivity of the end face could be reduced, as shown in FIG. 7, and at the same time, the substantial reflection in the window region could be eliminated. Therefore, by providing a window region of a limited length on either side of the light emitting region in the DFB laser equipped with the corrugation-phase inverting region, a vary stable single-wavelength operation can be obtained. The provision of an antireflection coating to the end face of each window region further heightens the effect of efficient radiation of the laser output light.

The both end faces need not always be cleavage planes but need only to be optically smooth, and it does not matter whether they are flat or convex. Accordingly, the end faces can be formed even by such industrial methods as chemical etching, sputter etching, plasma etching and like techniques. Moreover, since the laser region is spaced apart from the end faces, defects in the end faces would exert substantially no influence on the laser characteristic. Such a structure completely surrounding the laser region by semiconductor materials will also bring about favorable results in terms of long-term stability.

While in the above the compound semiconductor of the InGaSaP/InP system alloys has been exemplified as the semiconductor material, the DFB laser of the abovedescribed structure could be similarly obtained by the use of other semiconductor materials as of AlGaAs/GaAs or AlGaInAs/InP system alloys. Furthermore, although the foregoing description has been given on the assumption that the period $\Lambda$ is ½ of the oscillation wavelength in the waveguide, the same results could be obtained even if the period $\Lambda$ is an integral multiple of a half wavelength. Besides, the stripe structure of the laser oscillation region is not limited specifically to the buried stripe structure but may also be a grooved substrate stripe structure or the like.

As has been described in the foregoing, the DFB laser of the present invention is able to perform a very stable single-wavelength operation, as a device for practical use, in comparison with conventional DFB lasers. Moreover, since the laser oscillation region is not exposed to the outside, the laser end faces can be formed by etching or like industrial techniques so that high reliability can be achieved. Accordingly, the DFB laser of the present invention is applicable to high performance optical fiber communications and the like and is of great utility.

What we claim is:

1. In a distributed feedback semiconductor laser having a substrate, a light emitting layer, an adjoining layer next to the light emitting layer, either the light emitting layer or said adjoining layer having periodic corrugations extending in the direction of travel of light in said light emitting layer, a laser oscillation region, electrodes on said laser for effecting injection of carriers into said light emitting layer for performing of laser oscillations, the improvement which comprises at the center portion of said laser oscillation region a region in which the phase of the corrugations is changed by about 180 degrees, on an extension of the laser oscillation region at each end thereof a window region formed of a semiconductor layer larger in energy gap, but smaller in refractive index than the light emitting layer, and the window region at each end of the laser oscillation region having a length limited to effectively prevent substantial reflection of laser output light in the corresponding window region.

2. A distributed feedback semiconductor laser according to claim 1, in which the length of each said window region is smaller than a value of $l_a \tan(90-\theta)$, where $l_a$ is the thickness from the center of the light emitting layer to one of said electrodes disposed at a side opposite to the substrate; $\theta$ being an angle at which the laser output light is emitted into the window region.

* * * * *